(12) United States Patent
Wernsman et al.

(10) Patent No.: US 9,461,191 B2
(45) Date of Patent: Oct. 4, 2016

(54) MERCAPTO-BASED COUPLING AGENT FOR IMPROVED THERMOPHOTOVOLTAIC DEVICE BACK SURFACE REFLECTOR ADHESION AND REFLECTANCE

(71) Applicant: United States Department of Energy, Washington, DC (US)

(72) Inventors: Bernard Wernsman, Jefferson Hills, PA (US); Joseph N. Fiedor, Jefferson Hills, PA (US); Lawrence G. Irr, Trafford, PA (US); Marc N. Palmisiano, Pittsburgh, PA (US)

(73) Assignee: U.S. Department of Energy, Washington, DC (US)

( * ) Notice: Subject to any disclaimer, the term of this patent is extended or adjusted under 35 U.S.C. 154(b) by 167 days.

(21) Appl. No.: 14/187,666

(22) Filed: Feb. 24, 2014

(65) Prior Publication Data
US 2014/0238474 A1    Aug. 28, 2014

Related U.S. Application Data

(60) Provisional application No. 61/768,794, filed on Feb. 25, 2013.

(51) Int. Cl.
*H01L 31/044* (2014.01)
*H01L 31/04* (2014.01)
*G02B 5/02* (2006.01)
*G02B 5/08* (2006.01)
*H02S 10/30* (2014.01)

(52) U.S. Cl.
CPC ......... *H01L 31/0406* (2013.01); *G02B 5/0284* (2013.01); *G02B 5/08* (2013.01); *G02B 5/0808* (2013.01); *H02S 10/30* (2014.12)

(58) Field of Classification Search
CPC ....... H01L 31/00–31/078; Y02E 10/50–10/60
USPC .................................................. 136/243–265
See application file for complete search history.

(56) References Cited

U.S. PATENT DOCUMENTS

| | | | | |
|---|---|---|---|---|
| 6,300,557 B1* | 10/2001 | Wanlass | ............... | H01L 31/0735 136/256 |
| 6,483,098 B1* | 11/2002 | Kato | .................... | G02B 6/4214 250/214.1 |
| 2012/0111401 A1* | 5/2012 | Kang | ................ | H01L 31/02168 136/256 |
| 2013/0279001 A1* | 10/2013 | Mochizuki | ........... | G02B 5/0808 359/361 |

* cited by examiner

*Primary Examiner* — Bach Dinh
(74) *Attorney, Agent, or Firm* — Michael J. Badagliacca; Nathaniel M. Sloan; Robert T. Burns

(57) ABSTRACT

A back surface reflector (BSR) is described. The BSR includes a reflecting layer, a substrate and an adhesion layer between the reflecting layer and the substrate. The adhesion layer includes 3-mercaptopropyl (trimethoxy) silane (a.k.a. Merc).

16 Claims, 12 Drawing Sheets

MERCAPTO-BASED COUPLING AGENT FOR IMPROVED THERMOPHOTOVOLTAIC DEVICE BACK SURFACE REFLECTOR ADHESION AND REFLECTANCE

STATEMENT REGARDING FEDERALLY SPONSORED RESEARCH AND DEVELOPMENT

This invention was made with government support under DE-AC11-98PN38206 awarded by the United States Department of Energy. The United States Government has certain rights in the invention.

BACKGROUND

1. Field

Embodiments discussed herein relate to a back surface reflector (BSR) for thermophotovoltaic (TPV) systems.

2. Description of the Related Art

TPV systems include a radiator, optical cavity and TPV device, with the radiator and TPV device being on opposite sides of the optical cavity. A 20% heat-to-electric conversion efficiency may be achieved by using an InGaAs/InP TPV device and an etched radiator, at temperatures of ~1050° C. and ~26° C., respectively. To achieve this high conversion efficiency, both the diode and spectral efficiencies of the system must be high. Relatively high spectral efficiencies can be achieved by using either transmissive or reflective spectral control strategies. Each of these strategies requires a highly reflective (non-absorbing) back surface reflector (BSR).

For the transmissive spectral control strategy, most of the light is allowed into the TPV device. The spectral efficiency is highly dependent upon the ability of the back surface reflector to reflect low energy (less than the active region bandgap energy) photons back out of the TPV device. For the reflective spectral control scheme, a highly reflective BSR is needed to increase the diode efficiency by increasing the photon recycling. Therefore, specular, highly reflective BSRs are needed to maximize the efficiency of either type of TPV system.

A related BSR 100 for InGaAs/InP based TPV devices is shown in FIG. 1. The BSR 100 includes a reflector 110, an adhesion layer 120, a diffusion barrier 130 and a substrate 140. The reflector HQ is a 2000 Å Au reflector, the adhesion layer 120 is 50-200 Å and made of a transition metal, such as Ti, and the substrate 140 is made of InP or InGaAs. The diffusion barrier 130 is made of $SiO_2$ or $Si_3N_4$ and prevents the diffusion of in from the InP substrate 140 into the Au reflector 110. The major loss of reflectivity is in the adhesion layer 120 due to the high characteristic absorption of this material (as well as other transition metals) for wavelengths <7 µm. The absorption of the Ti can be reduced by making the adhesion layer 120 thinner, but this may result in incomplete coverage of the adhesion layer 120, which may result in inadequate adhesion. In order to achieve proper adhesion, the standard Ti adhesion layer for InGaAs/InP TPV devices is 125 Å.

One way to eliminate the trade-off between reflectivity and thickness is to use a single monolayer of adhesive material that has minimal absorption. However, this is difficult to achieve with standard deposition techniques (i.e., evaporation, sputtering, CVD), because film growth is determined by the flux of the depositing species and the adatom mobility of that species on the substrate surface. These two considerations prevent perfect monolayer growth, and lead to island formation and roughening that makes it necessary to deposit even more material to ensure complete coverage of the substrate.

In light of the foregoing, there is a need for a BSR having an adhesive material with good coverage and high reflectivity/minimal absorption, particularly in the 1-10 µm spectral range.

BRIEF SUMMARY

To solve the above and/or other problems, it is an aspect of the described embodiments to provide a back surface reflector (BSR), including a reflecting layer; a substrate; and an adhesion layer between the reflecting layer and the substrate, the adhesion layer including 3-mercaptopropyl (trimethoxy) silane.

To solve the above and/or other problems, it is another aspect of the described embodiments to provide a back surface reflector (BSR), including: a reflecting layer; and an adhesion layer on the substrate, the adhesion layer including a molecular coupling agent.

To solve the above and/or other problems, it is an aspect of the described embodiments to provide a thermophotovoltaic (TPV) system, including: a radiator; an optical cavity; and a TPV device, the TPV device including a back surface reflector (BSR), a reflecting layer; a substrate; and an adhesion layer between the reflecting layer and the substrate, the adhesion layer including 3-mercaptopropyl (trimethoxy) silane.

Additional aspects and/or advantages will be set forth in part in the description which follows and, in part, will be apparent from the description, or may be learned by practice thereof.

BRIEF DESCRIPTION OF THE SEVERAL VIEWS OF THE DRAWINGS

These and/or other aspects and advantages will become more readily appreciated from the following description of embodiments, taken in conjunction with the accompanying drawings in which.

DETAILED DESCRIPTION OF THE EMBODIMENTS

Figure 1:
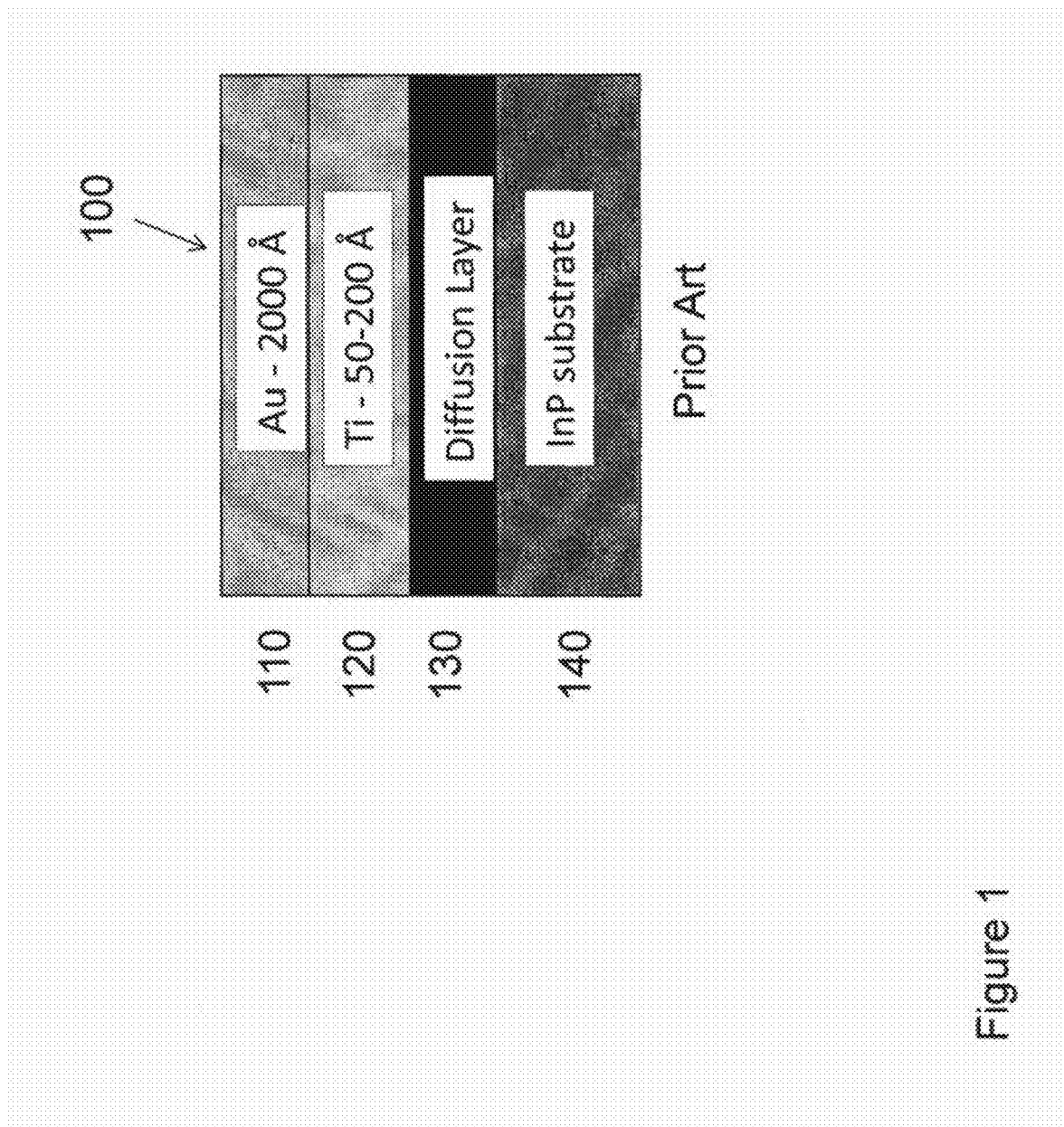
FIG. 1 is an illustration of a related BSR.

Embodiments are described below, examples of which are illustrated in the accompanying drawings, wherein like reference numerals refer to the like elements throughout. Although a few embodiments have been shown and described, those skilled in the art will appreciate that changes may be made in these embodiments without departing from the principles and spirit of the embodiments, the scope of which is defined in the appended claims and their equivalents.

Figure 2:
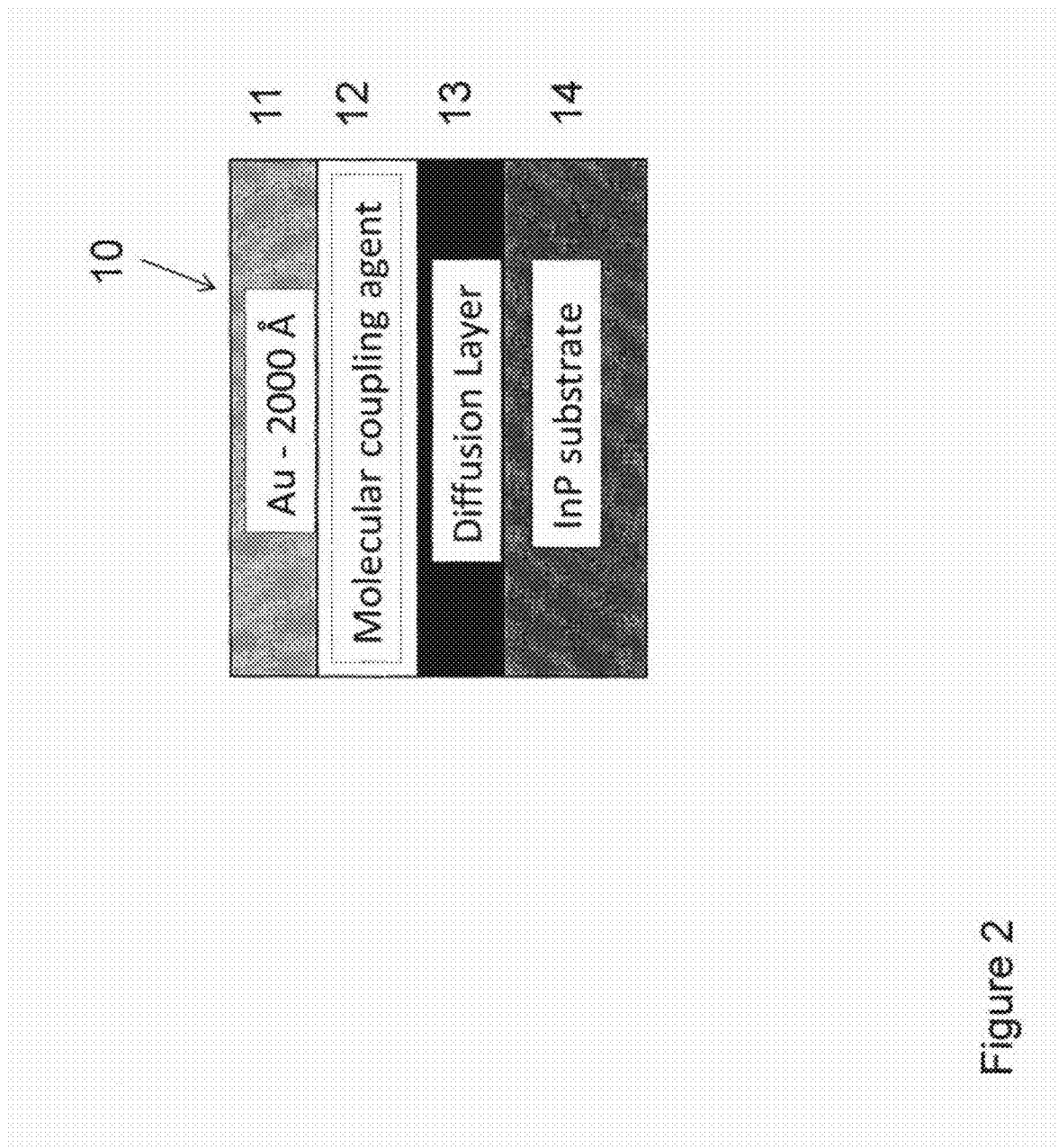
FIG. 2 is an illustration of a BSR according to a present embodiment.
Figure 4:
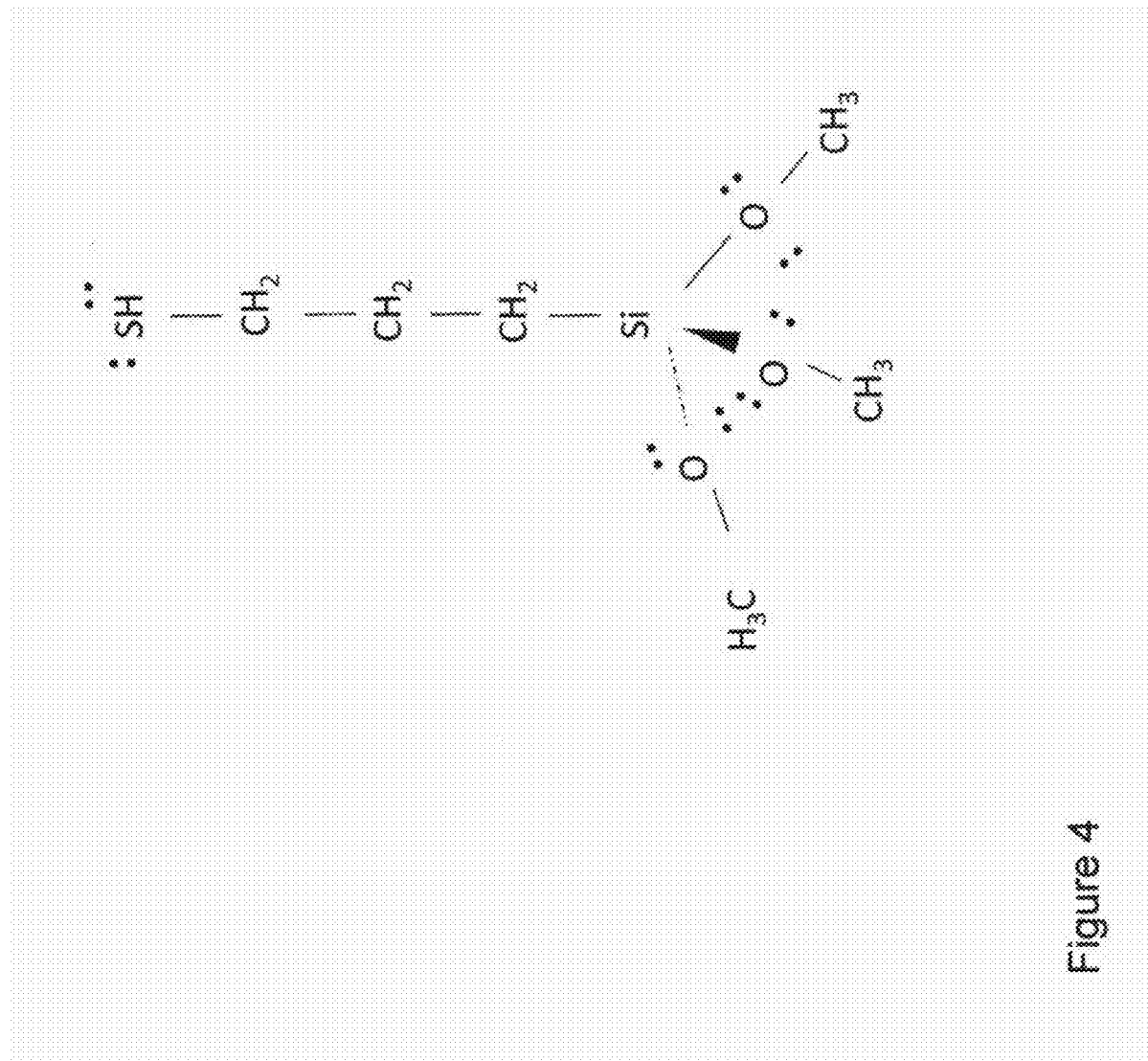
FIG. 4 is an illustration of the chemical structure of the Merc adhesion layer according to a present embodiment.

FIG. 2 is an illustration of a BSR 10 according to a present embodiment. The BSR 10 includes a reflector 11, an adhesion layer 12, a diffusion barrier 13 and a substrate 14. The reflector 11 may be a 2000 Å Au reflector, the substrate 14 may be made of InP and the diffusion barrier 13 may be made of $SiO_2$ or $Si_3N_4$ and prevents the diffusion of In from the InP substrate 14 into the Au reflector 11. The adhesion layer 12 may be made of 3-mercaptopropyl (trimethoxy) silane, $HS(CH_2)_3Si(OCH_3)_3$, (hereinafter "Merc"), and may be as thin as 8 Å. FIG. 4 is an illustration of the chemical structure of the Merc adhesion layer 12.

Figure 3:
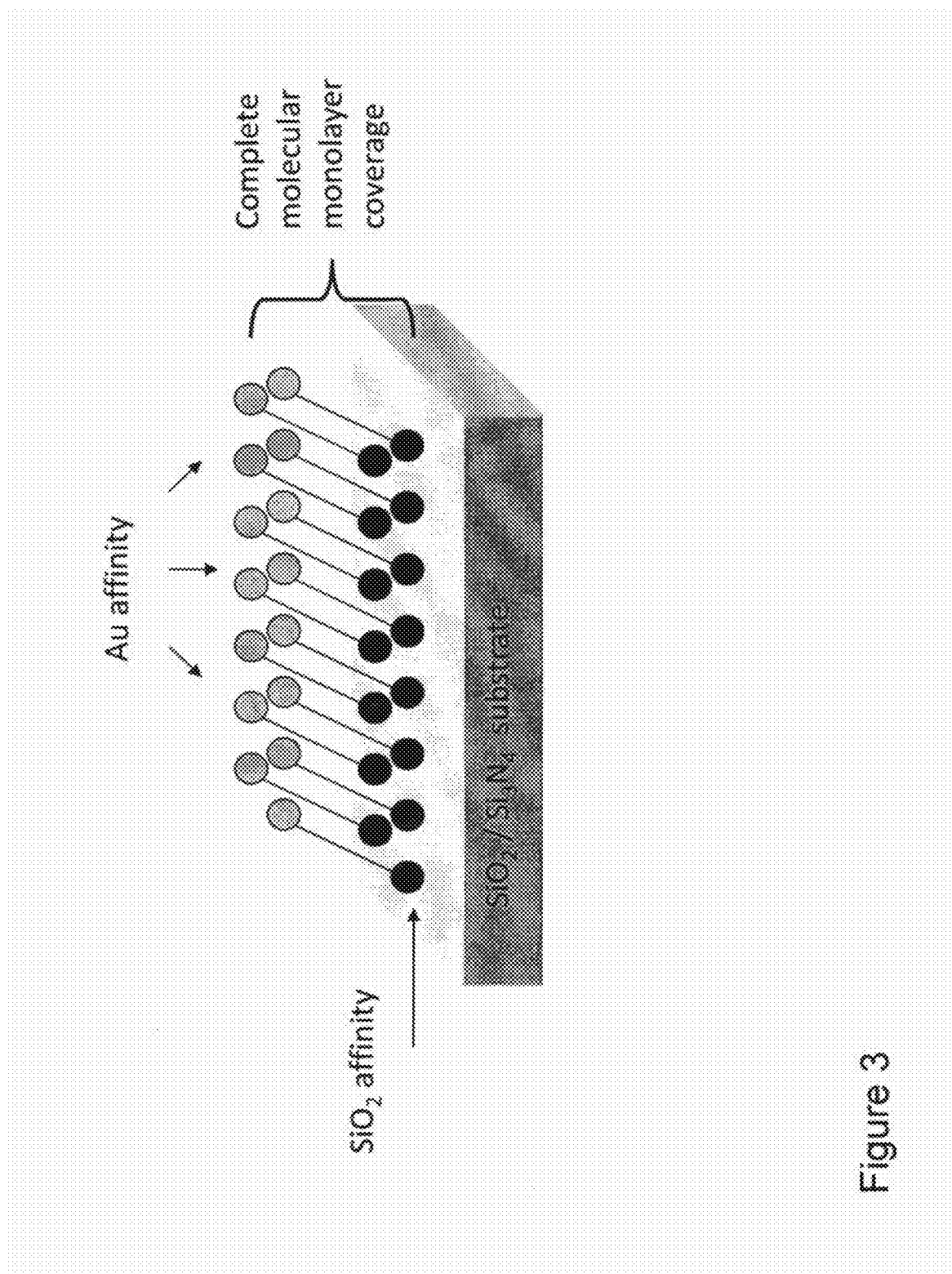
FIG. 3 is a perspective view of a monolayer according to a present embodiment adhering to $SiO_2/Si_3N_4$.

Merc is a self assembled monolayer (SAM). Typically, SAMs are organic chain molecules that are terminated with specific functional groups. One end of the SAM molecule contains a functional group that has a high affinity for the substrate surface that it is designed to attach to, while the other end (terminating end) contains the new functionality desired for the surface. The molecules strongly bond to the substrate surface, but have little chemical interaction with each other, such that the individual molecules spontaneously align in a monolayer with their terminating functionality directed away from the surface. A second monolayer does not form on top of the first, because the molecules have little interaction with each other. FIG. 3 is a perspective view of such a monolayer adhering to $SiO_2/Si_3N_4$. Thus, the use of SAMs generally ensures monolayer coverage of a surface.

In addition to providing coverage, a SAM could be used as a "monolayer molecular coupling agent", for example, to adhere the Au reflector 11 to the $SiO_2$ or $Si_3N_4$ coated InP substrate 14. One end of the SAM molecule would need an affinity for $SiO_2$ or $Si_3N_4$, while the other would need an affinity for Au. One molecule that meets these criteria is Merc. Specifically, the silane groups (—SiO—R) that terminate one end of this molecule bond strongly to $SiO_2$ while the mercaptan (—SH) groups have a tendency to bond to Au.

Merc is a colorless, oily liquid at room temperature with a pungent sulfur-like odor. Merc must be diluted in an organic solvent such as acetone ($CH_3COCH_3$), carbon tetrachloride ($CCl_4$), chloroform ($CHCl_3$), or dichloromethane ($CH_2Cl_2$) in order to be applied to the substrate 14. It is critical that the solvent be dry because water in the solvent can lead to polymerization of the silane portion of the Merc, degrading its ability to function as an adhesion layer. As one example, acetone was used as the solvent and the Merc was diluted from between 10:1 and 5:1 acetone:Merc. The mixture was placed in a Pyrex crystallization dish, and covered to avoid evaporation of the acetone. InP substrates coated with either $Si_3N_4$, $SiO_2$ or both were rinsed in acetone/isopropanol, plasma cleaned (50:50 $O_2$:Ar), then placed in the solution and allowed to soak for 15 minutes. This soak time is not critical, longer times have been used successfully but shorter times were not investigated in this work. After soaking, the samples were placed on a clean room towel and the excess solution was either blown off with dry $N_2$, rinsed with acetone, or allowed to evaporate in air. Samples that were to be coated with Au were loaded immediately into the e-beam evaporator to avoid atmospheric exposure that could lead to unwanted polymerization. Au BSRs were then deposited by thermal evaporation using a W boat, in order to function as desired as an adhesion layer, the Merc itself cannot show absorption in the 1-10 μm spectral range and cannot degrade under typical TPV operating conditions.

Figure 5:
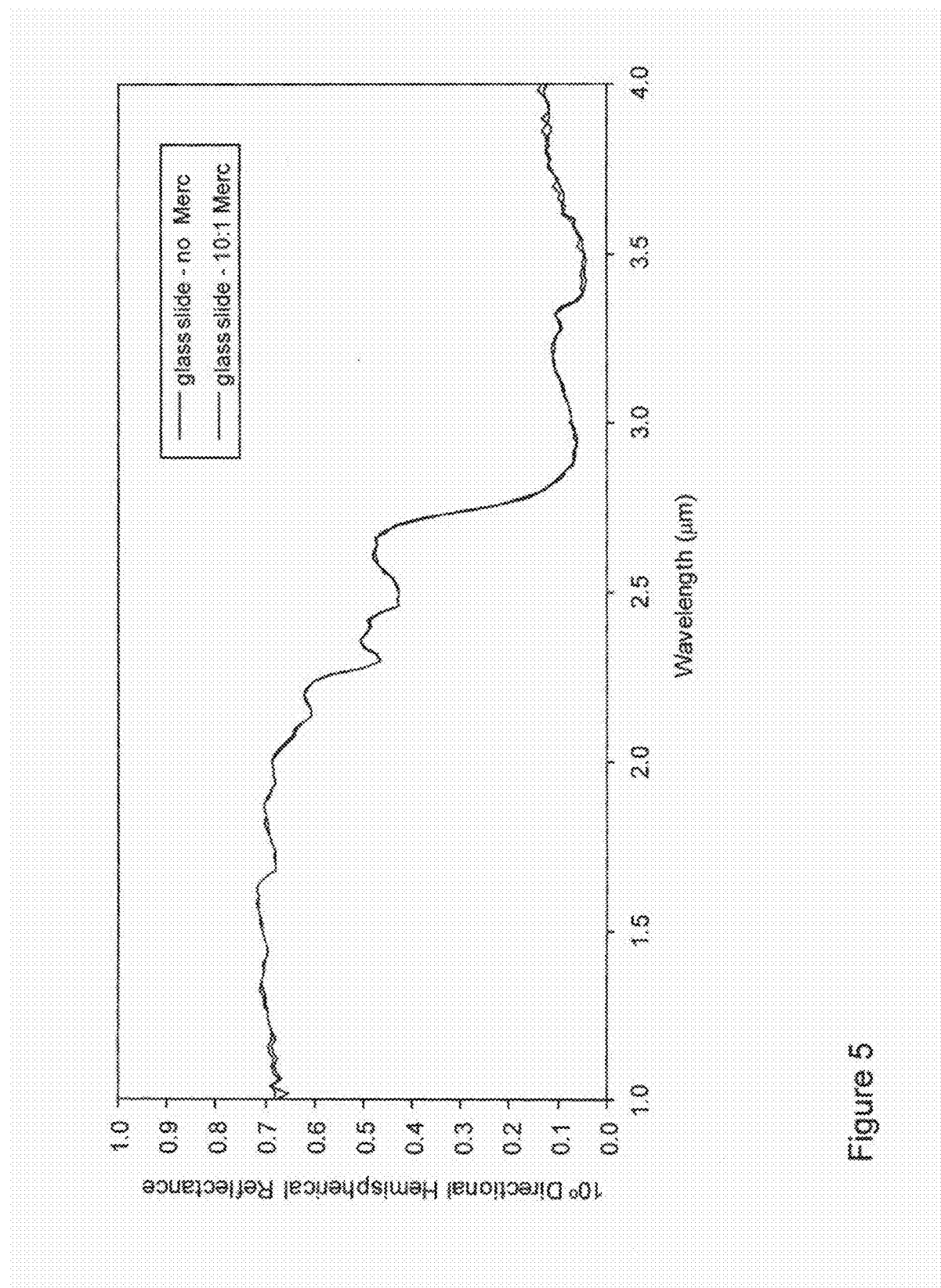
FIG. 5 is a graph illustrating 10° directional hemispherical reflectance measurement of a glass microscope slide with and without the Merc molecular coupling agent, according to a present embodiment.

FIG. 5 is a graph illustrating 10° directional hemispherical reflectance measurement of glass microscope slide with and without the Merc molecular coupling agent according to an embodiment. For initial testing, a 10:1 mixture of acetone:Merc was applied to a piece of glass microscope slide mounted in a standard AlN MIM saddle used for TPV device testing. The microscope slide provided the best case of a smooth surface, consisting mainly of $SiO_2$ for the Merc to adhere to. Excess Merc was blown off with dry $N_2$. According to FIG. 5, the curve shows no absorption by the Merc in the wavelengths of interest. In order to test the robustness of the Merc, the Merc coated Au specimen was inserted in the in-vacuum efficiency test stand and examined under 1000° C. gray body illumination at a MIM saddle temperature of 25° C. The major concerns in this test are that the Merc could undergo some photo induced chemical change that could decrease the reflectance of the device, or that the Merc or Merc byproducts could evaporate from the specimen and coat the radiator, lowering its emissivity. Neither was the case, as the Merc coated microscope slide and the radiator retained the same reflectance spectrum as before the test.

Figure 6:
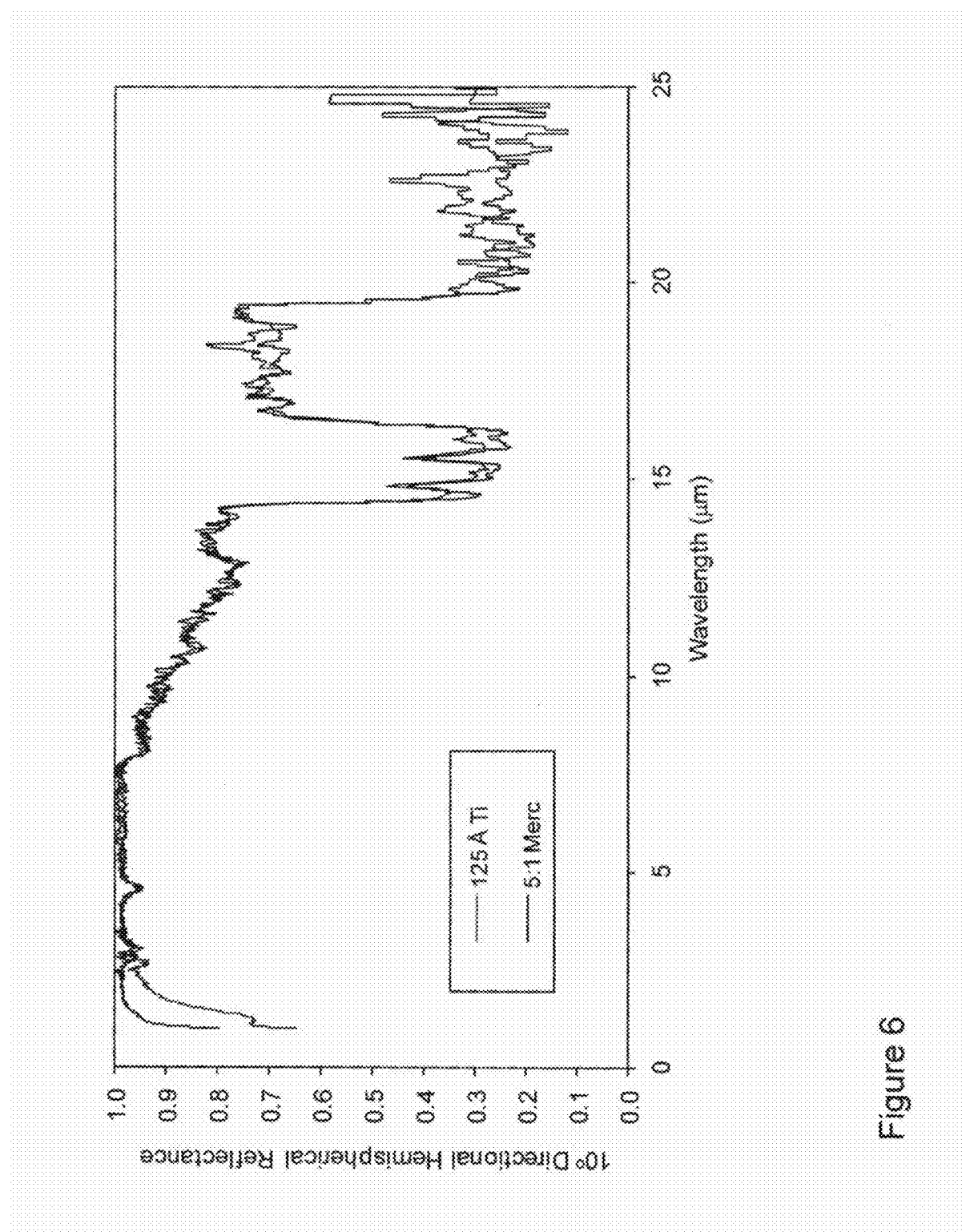
FIG. 6 is a graph illustrating 10° directional hemispherical reflectance measurement of 1800 Å Au BSRs deposited on 1000 Å $SiO_2$/2000 Å $Si_3N_4$/InP utilizing a Ti (related BSR) and the Merc molecular coupling agent, according to a present embodiment.

FIG. 6 is a graph illustrating 10° directional hemispherical reflectance measurement of 1800 Å Au BSRs deposited on 1000 Å $SiO_2$/2000 Å $Si_3N_4$/InP glass microscope slide with and without the Merc molecular coupling agent according to an embodiment.

The same Merc application procedure was used to adhere the 1800 Å Au BSR to an InP substrate coated first with a 2000 Å of $Si_3N_3$ and subsequently with 300 Å of $SiO_2$. The $SiO_2$ overlayer is used because it is more chemically similar to the silane functional group of the Merc than the $Si_3N_4$. The drawback to the $SiO_2$ overlayer is a characteristic absorption at about 10 μm, but at this wavelength there is relatively very little photon flux at typical system operating temperatures. FIG. 6 compares the reflectance of this Merc containing BSR compared to a BSR utilizing a 125 Å Ti adhesion layer deposited on InP coated with 2000 Å $Si_3N_4$. In the critical 2-5 micron region of the spectrum, the Merc based BSR has higher reflectance. In order to test the adhesion of the BSR using the Merc, a standard tape pull test was performed on a number of samples that had the excess Merc, solution (5:1 and 10:1 acetone:Merc) removed in the various ways described above. Also, two control samples including InP substrate/2000 Å $Si_3N_4$/300 or 1000 Å $SiO_2$/1800 Å Au were tested for comparison. To make the test more reproducible, double-sided tape was placed on the end of a 56 g stainless steel rod. The rod is placed on the sample such that only the weight of the rod is pressing the tape against the Au samples. All of the samples with the Merc adhesion layer passed the test except for one of the 10:1 sample that was allowed to air dry. The control samples with no Merc both failed the tape pull test.

Figure 7A:
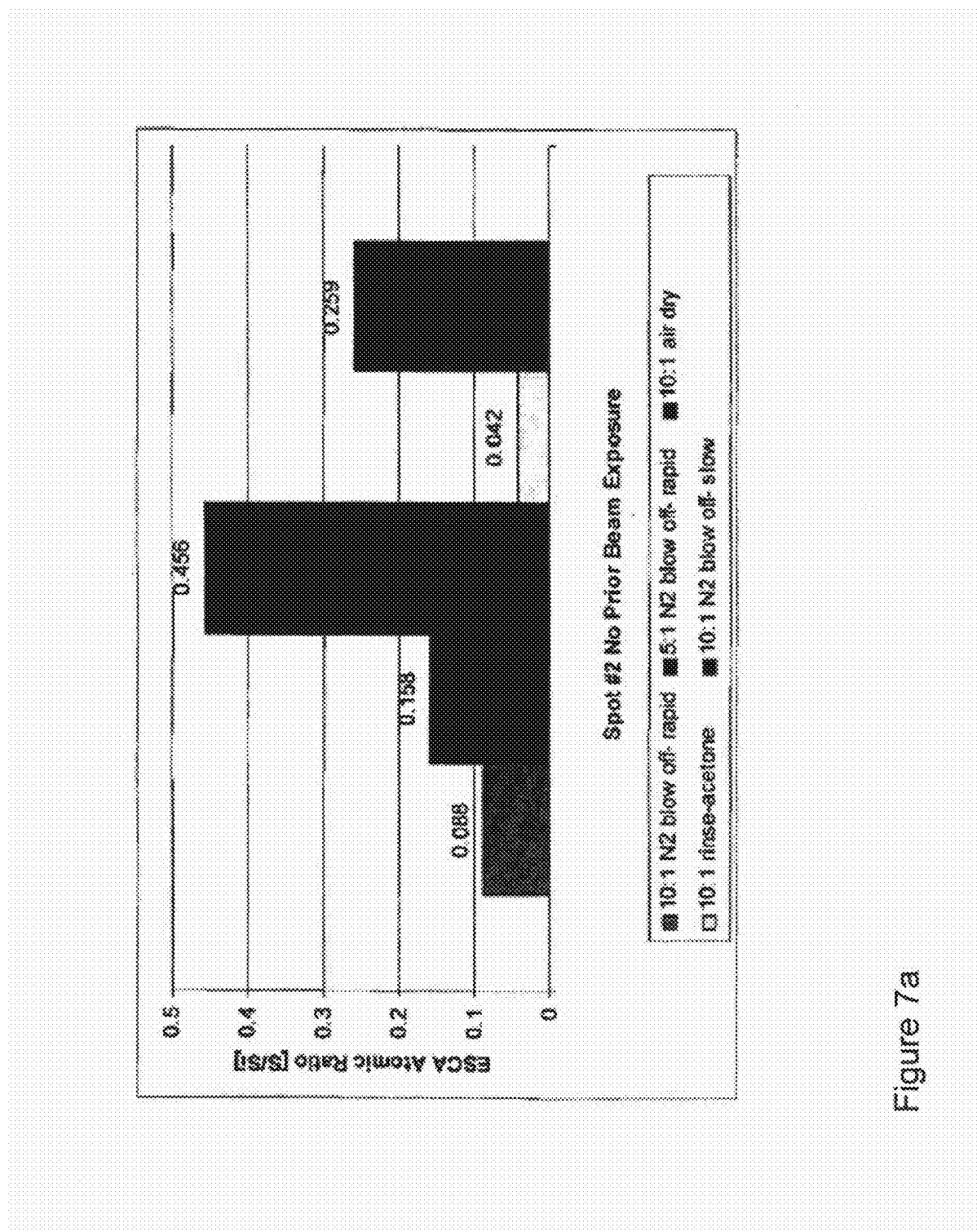
FIGS. 7A-7C are graphs illustrating X-ray Photoelectron Spectroscopy (XPS) intensity ratios for samples of InP/2000 Å $Si_3N_4$/1000 Å $SiO_2$ treated with the Merc coupling agent according to an embodiment, using various methods of excess solution material.
Figure 7B:
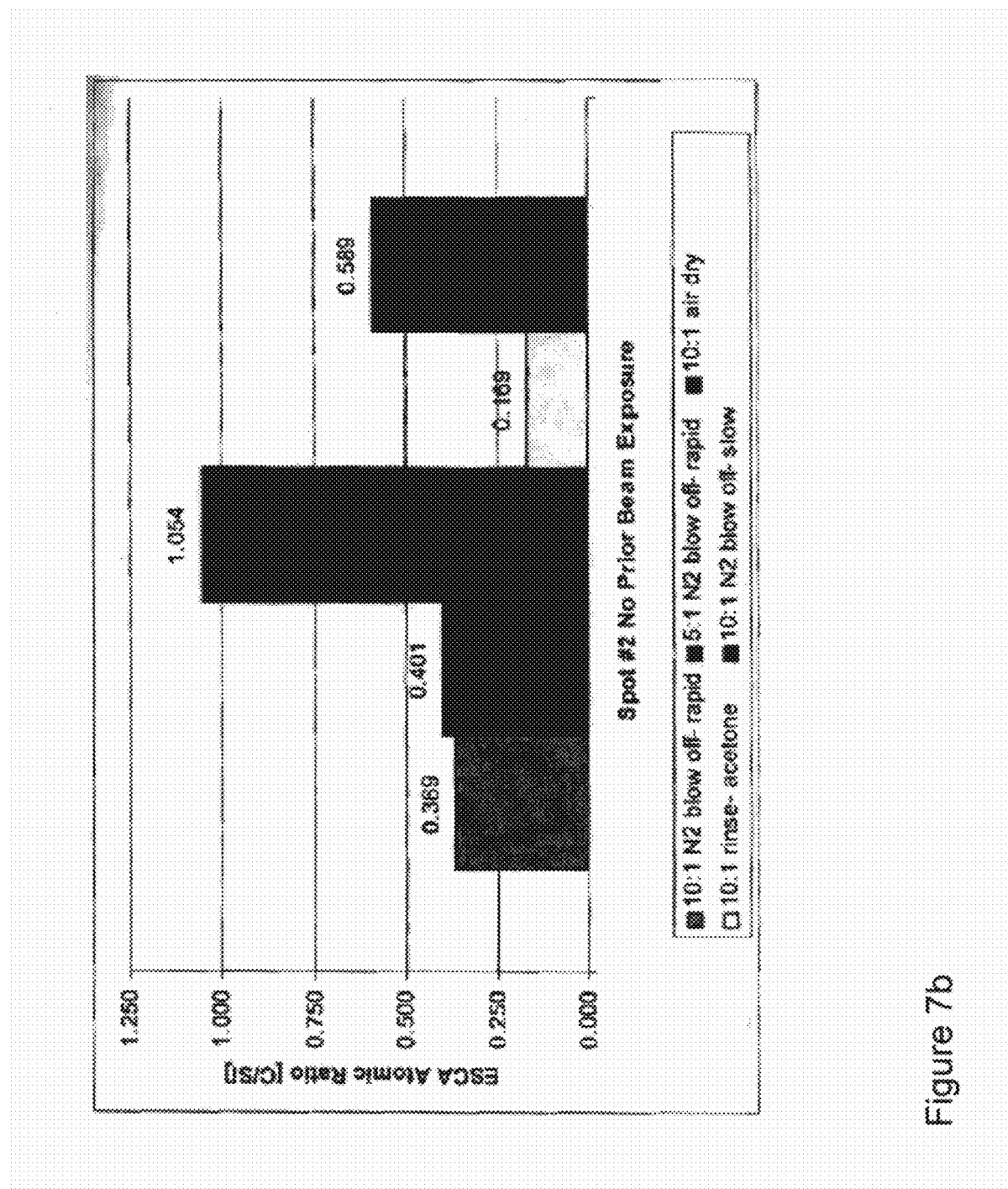
Figure 7C:
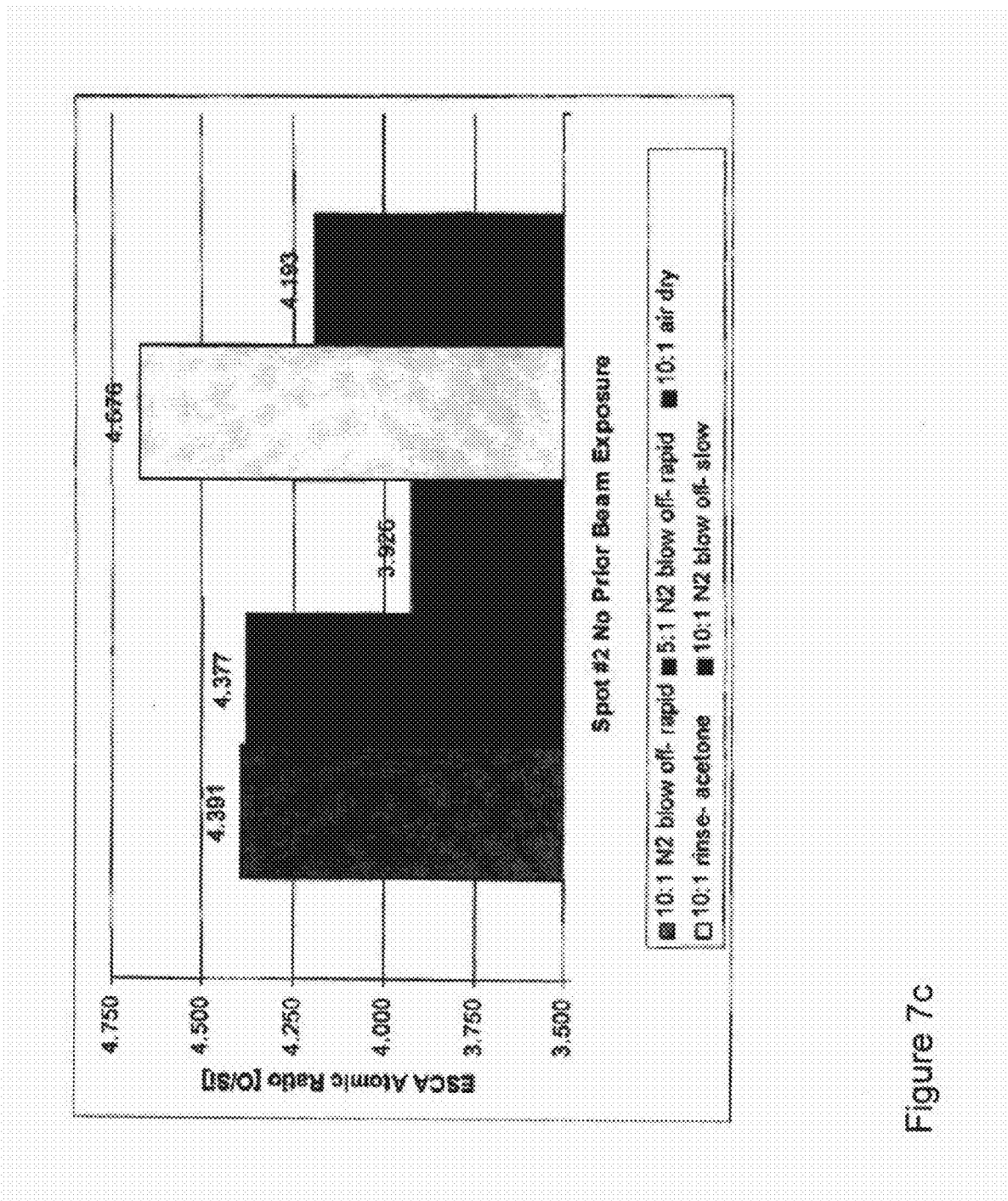

FIGS. 7A-7C are graphs illustrating X-ray Photoectron Spectroscopy (XPS) intensity ratios for samples of InP/2000 Å $Si_3N_4$/1000 Å $SiO_2$ treated with the Merc coupling agent according to a present embodiment, using various methods of excess solution material. XPS is a surface analytical technique used to monitor the first 100 Å of a material.

In order to determine the effectiveness of the Merc application, XPS analyses were performed on test samples of InP coated with 2000 Å $Si_3N_4$ and 1000 Å $SiO_2$ treated with Merc. All Merc applications involved a 15 minute soak of the sample in Merc/acetone solution. The following Merc treatments were evaluated: 1) acetone/Merc 10:1, excess blown off with $N_2$ rapidly 2) acetone/Merc 10:1, excess blown off with $N_2$ slowly 3) acetone/Merc 10:1, excess rinsed off with acetone 4) acetone/Merc 10:1, dried in air (excess evaporates), 5) acetone/Merc 5:1, excess blown off with $N_2$ rapidly. Specimens were stored in a dessicator prior to analysis.

Since Si and O are components of the underlying $SiO_2$ and C is a ubiquitous surface contaminant, the XPS intensity of the S 2p peak, which is an elemental consistuent of Merc, would be directly related to the amount of Merc present on the sample. If the S 2p XPS intensity is ratioed to Si 2p XPS intensity, quantitative comparisons can be made between the ratios although the ratio itself is not a quantitative measure of the relative amounts of S and Si. While the XPS [S 2p/Si 2p] intensity ratio (See FIG. 7A) is the most direct way to examine the Merc application, XPS [C 1s/Si 2p] intensity ratios (See FIG. 7B) and XPS [O 1s/Si 2p] (See FIG. 7C) intensity ratios will give information that should corroborate the information on the degree of the Merc coverage. The XPS [C 1s/Si 2p] intensity ratio should follow the trend of the XPS [S 2p/Si 2p] intensity because C is the main elemental constituent in the Merc and any adventitious C should be minor in comparison. The XPS [O 1s/Si 2p] intensity ratio should follow the opposite trend of the XPS [S 2p/Si 2p] and XPS [C 1s/Si 2p] intensity ratios because O makes up a much larger elemental proportion within $SiO_2$ than that found in the Merc, and therefore a higher XPS [O 1s/Si 2p] intensify ratio corresponds to less coverage of the Merc.

FIGS. 7A-7C show the XPS S 2p/Si 2p intensity ratio for the various Merc treatments described above, in general, there is a great deal of variation in the XPS S 2p/Si 2p intensity ratio, and therefore a great deal of variation in the Merc coverage. As one would expect, the sample in which the excess Merc solution was allowed to evaporate shows the most Merc on the surface while the sample that, was rinsed in acetone shows the least. There is a significant difference (almost a factor of 3) between the sample that was blown off slowly and the one that was blown off rapidly. This shows that small changes in the Merc application process can have large impacts on the coverage of the adhesion layer. The adhesion layer is ideally only a monolayer of Merc, thus small changes in the residence time of the Merc solution on the sample and the evaporation rate of the solution can have a large effect on the final chemistry of the surface. The ratio of acetone/Merc also has a profound impact. For instance, the sample with 5:1 acetone/Merc had XPS S 2p/Si 2p intensity ratio of 0.158 while the sample with 10:1 acetone/Merc application had a ratio of 0.088, nearly a factor of 2 difference for the same rapid $N_2$ blow off procedure. The XPS [C 1s/Si 2p] intensity ratio shows the same trends (FIG. 7B) as the XPS S 2p/Si 2p intensity in that the air dried sample exhibits the highest XPS [C 1s/Si 2p] intensity ratio while the acetone rinsed sample exhibits the lowest. The XPS [O 1s/Si 2p] intensity ratio (FIG. 7C) also affirms these trends that the samples with most Merc coverage (XPS S 2p/Si 2p] intensity ratio have the least signal from the underlying $SiO_2$ (lowest XPS [O 1s/Si 2p] intensity ratio).

Samples treated with Merc identically to the XPS specimens were coated with an 1800 Å Au BSR and subjected to the tape pull adhesion test. As mentioned above, the only Merc treated sample that failed was the 10:1 sample deposited on 1000 Å of $SiO_2$. A reasonable explanation for this can be seen in the XPS data. The samples allowed to air dry had by far the highest. XPS [O 1s/Si 2p] intensity ratio and therefore highest Merc coverage. It is possible that greater than a monolayer of Merc could have been applied to these samples, leaving the BSR subject to failure within the Merc layer.

Figure 8:
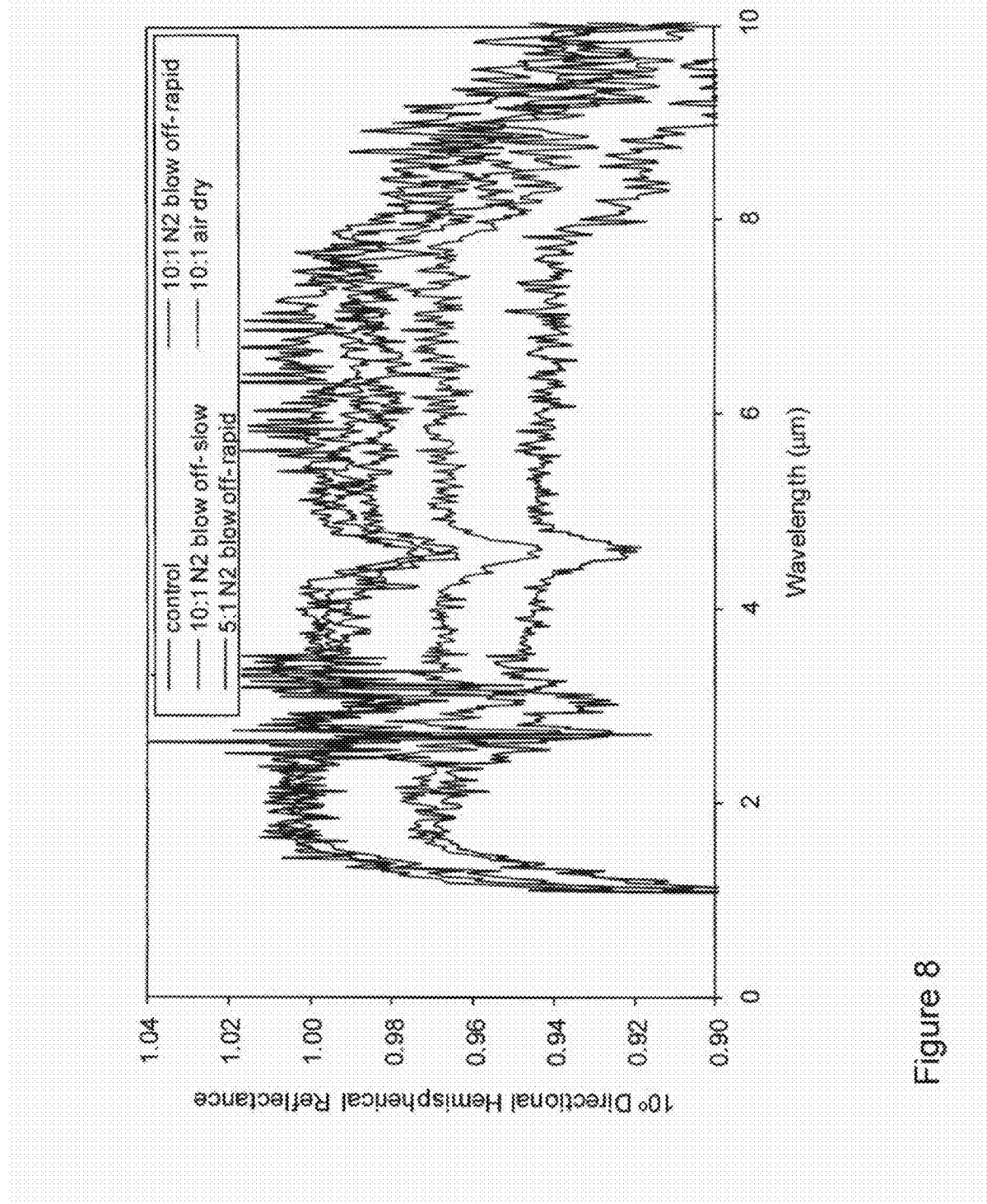
FIG. 8 shows the 10° directional hemispherical reflectance versus wavelength over the spectral range of 1-10 µm for the Merc BSR samples deposited on 300 Å $SiO_2$ according to an embodiment, and the control sample.

FIG. 8 shows the 10° directional hemispherical reflectance versus wavelength over the spectral range of 1-10 μm for the Merc BSR samples deposited on 300 Å $SiO_2$ and the control sample. Reflectance measurements were performed on duplicates of the adhesion samples (prepared at the same time) to examine the effect of the various Merc treatments on BSR optical performance. Interestingly, the samples with higher degrees of Merc coverage, as measured by XPS, show the highest reflectance. The 10:1 sample dried in air and 5:1 sample blown off with $N_2$ exhibited 1-3% higher reflectance in the range of interest than the 10:1 samples that were blown off slowly or rapidly. The control sample with no Merc application had the highest reflectance at 100%, using a diffuse reflectance integrating sphere employing a diffuse standard.

Figure 9:
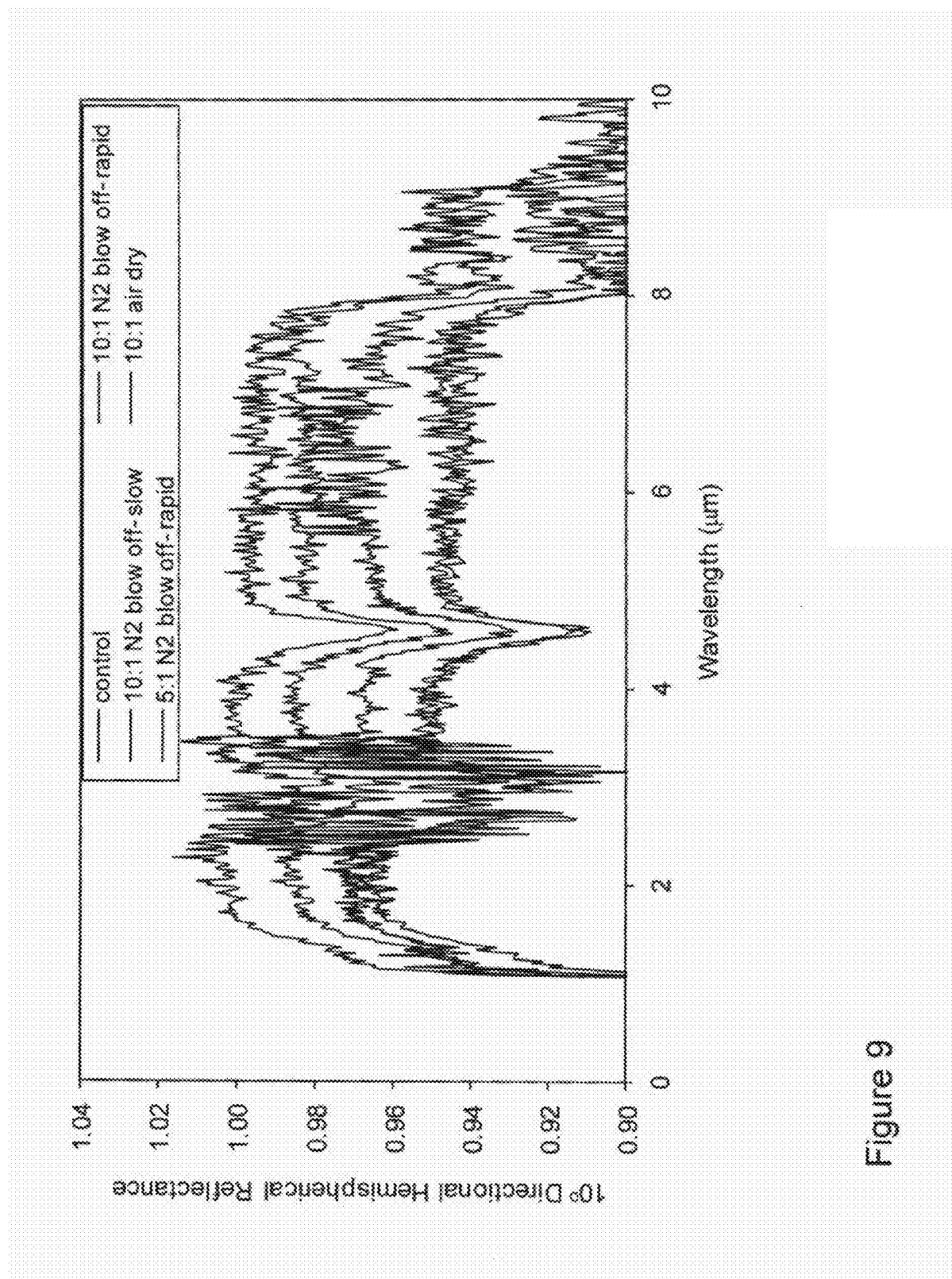
FIG. 9 is a graph illustrating 10° directional hemispherical reflectance measurement for 1800 Å Au BSR deposited on 1000 Å $SiO_2$/2000 Å $Si_3N_4$/InP using a Merc adhesion layer according to a present embodiment, showing a variation in reflectance as a function of excess Merc removal procedure and starting Merc mixture composition.

FIG. 9 is a graph illustrating 10° directional hemispherical reflectance measurement for 1800 Å Au BSR deposited on 1000 Å $SiO_2$/2000 Å $Si_3N_4$/InP using a Merc adhesion layer according to a present embodiment, showing a variation in reflectance as a function of excess Merc removal procedure and starting Merc mixture composition. The same experiment was run using a 1000 Å thick $SiO_2$ layer to anchor the Merc to the $Si_3N_4$ coated InP substrate. The 10° directional hemispherical reflectance data is shown in FIG. 9 for samples with various Merc treatments. Again, the samples with higher coverage of Merc exhibit the greatest reflectance. The 10:1 sample dried in air and 5:1 sample blown off with $N_2$ exhibited 3-5% higher reflectance in the range of interest than the 10:1 samples that were blown off slowly or rapidly. In general, the thicker $SiO_2$ layer should decrease the reflectance of the stack due to its characteristic absorption in the wavelength range of interest. This is observed in the data, as the 300 Å $SiO_2$ control sample has a reflectance of 100%, while the 1000 Å control sample had a reflectance of a little over 96%. In this case, two of the samples with the greatest Merc coverage have a reflectance greater than that of the control sample. One way that these observations can be explained is that the coherency of the interface is improved with more complete coverage of the Merc. On an atomic scale, the presence of the Merc causes the depositing Au to form a stronger chemical bond and a physically smoother interface. This manifests itself in higher reflectance of the samples with more complete Merc coverage in the case of both the 300 Å and 1000 Å $SiO_2$.

Although not illustrated, in order to understand more about the effect of Merc on the initial stages of Au film growth, atomic force microscopy (AFM) was used to analyze 50 Å Au films deposited on 10:1 Merc treated samples of 1000 Å $SiO_2$/2000 Å $Si_3N_4$/InP. The excess Merc was removed with a slow or rapid $N_2$ blow off, or was rinsed off in acetone. AFM scans for the acetone rinse and slow N₂ blow off samples indicated that the Au deposited on the acetone rinsed sample is rougher, with an RMS roughness of 2.659 nm, as compared to 1.151 nm for the slowly blown off sample. Taking into account the XPS results on similar samples, this shows that the degree of Merc coverage can indeed affect the roughness of the overlying Au.

Based on the above adhesion, XPS, and reflectance data, it is noted that the 5:1 acetone/Merc with a rapid N₂ blow off never failed an adhesion test, showed a high degree of Merc coverage, and high reflectance. The XPS sample with the excess Merc slowly blown off showed a high degree of Merc coverage, but this did not translate into high reflectance. This may be due to poor reproducibility associated with the slow N₂ blow off procedure, in which there is too little control over the actual Merc solution removal rate by the operator. The rapid N₂ blow off is done as rapidly as possible upon removal from the Merc solution, thus there is less room for variability.

Figure 10:
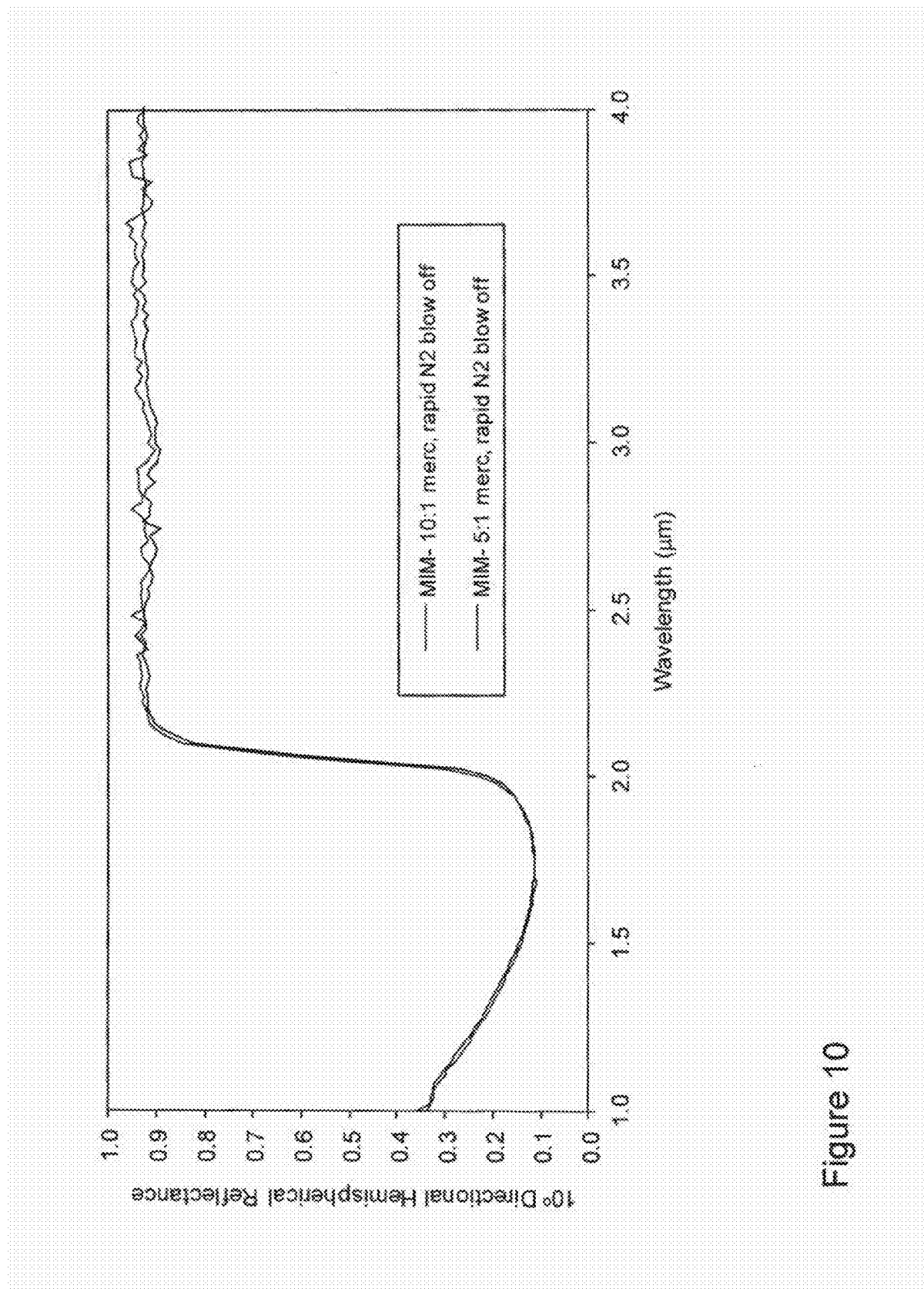
FIG. 10 is a graph illustrating the comparison of the 10° directional hemispherical reflectance of MIM devices using 10:1 and 5:1 Merc solutions, according to an embodiment.

To test the conclusions developed from this data, BSRs were applied to fully processed MIM devices using 10:1 and 5:1 Merc solutions with the excess rapidly blown off with N₂. The backs of the MIM devices were coated only with Si₃N₄ to avoid any SiO₂ absorption. FIG. 10 is a graph illustrating the comparison of the 10° directional hemispherical reflectance of these two devices and shows that the 5:1 Merc BSR has a 1-2% higher reflectance in ~2-4 µm spectral range. By controlling the application of the Merc, the reflectance of the BSR can be maximized.

According to the foregoing, Merc provides strong adhesion between SiO₂ or Si₃N₄ and Au while showing an increase in the relatively low energy photon reflectance, as compared to Ti adhesion layers. Thus, by using this monolayer adhesion layer, the performance and reliability of the TPV system using InGaAs/InP devices may be enhanced as compared to Ti.

What is claimed is:

1. A thermophotovoltaic (TPV) device comprising at least one back surface reflector comprising:
    a reflecting layer;
    a substrate;
    a diffusion layer between the reflecting layer and the substrate; and
    an adhesion layer between the reflecting layer and the diffusion layer, the adhesion layer comprising 3-mercaptopropyl (trimethoxy) silane having at least one silane group and at least one mercaptan group,
    wherein the adhesion layer comprises a monolayer molecular coupling agent in which the least one silane group bonds to the diffusion layer and the at least one mercaptan group bonds to the reflecting layer,
    wherein the adhesion layer covers the reflecting layer, and
    wherein the adhesion layer has a thickness of about 8 angstroms.

2. The TPV device of claim 1, wherein the reflecting layer comprises Au.

3. The TPV device of claim 2, wherein the substrate comprises InP.

4. The TPV device of claim 2, wherein the reflecting layer has a thickness of about 2000 angstroms.

5. The TPV device of claim 1, wherein the diffusion layer comprises SiO₂, Si₃N₄, or a combination thereof.

6. The TPV device of claim 5, wherein the diffusion layer comprises a SiO₂ layer and a Si₃N₄ layer.

7. The TPV device of claim 6, wherein the SiO₂ layer has a thickness of about 300 angstroms and the Si₃N₄ layer has a thickness of about 2000 angstroms.

8. The TPV device of claim 6, wherein the SiO₂ layer has a thickness of about 1000 angstroms.

9. A thermophotovoltaic (TPV) system, comprising: a radiator; an optical cavity; and the TPV device of claim 1, the optical cavity being between the TPV device and the radiator.

10. The TPV system of claim 9, wherein the reflecting layer comprises Au.

11. The TPV system of claim 10, wherein the substrate comprises InP.

12. The TPV system of claim 10, wherein the reflecting layer has a thickness of about 2000 angstroms.

13. The TPV system of claim 9, wherein the diffusion layer comprises SiO₂, Si₃N₄, or a combination thereof.

14. The TPV system of claim 13, wherein the diffusion layer comprises a SiO₂ layer and a Si₃N₄ layer.

15. The TPV system of claim 14, wherein the SiO₂ layer has a thickness of about 300 angstroms and the Si₃N₄ layer has a thickness of about 2000 angstroms.

16. The TPV system of claim 14, wherein the SiO₂ layer has a thickness of about 1000 angstroms.

* * * * *